United States Patent
Li et al.

(10) Patent No.: US 12,108,610 B2
(45) Date of Patent: Oct. 1, 2024

(54) ONE TRANSISTOR ONE MAGNETIC TUNNEL JUNCTION MULTIPLE BIT MAGNETORESISTIVE RANDOM ACCESS MEMORY CELL

(71) Applicant: QUALCOMM Incorporated, San Diego, CA (US)

(72) Inventors: Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 418 days.

(21) Appl. No.: 17/313,834

(22) Filed: May 6, 2021

(65) Prior Publication Data

US 2022/0359611 A1 Nov. 10, 2022

(51) Int. Cl.
*H10B 61/00* (2023.01)
*G11C 11/16* (2006.01)
(Continued)

(52) U.S. Cl.
CPC .......... *H10B 61/20* (2023.02); *G11C 11/1655* (2013.01); *G11C 11/1657* (2013.01);
(Continued)

(58) Field of Classification Search
CPC ................ H10B 61/20; G11C 11/1655; G11C 11/1657; H10N 50/10; H10N 50/80; H10N 50/85
See application file for complete search history.

(56) References Cited

U.S. PATENT DOCUMENTS

| | | | |
|---|---|---|---|
| 2009/0174015 A1* | 7/2009 | Gu | H10N 50/10 |
| | | | 257/E29.323 |
| 2012/0170357 A1* | 7/2012 | Apalkov | G11C 11/16 |
| | | | 365/158 |

(Continued)

FOREIGN PATENT DOCUMENTS

| | | |
|---|---|---|
| KR | 102117393 B1 | 6/2020 |
| WO | 2011139235 A1 | 11/2011 |

OTHER PUBLICATIONS

D. D. Lam et al., MgO Overlayer Thickness Dependence of Perpendicular Magnetic Anisotropy in CoFeB Thin Films, Journal of the Korean Physical Society, vol. 62, No. 10, May 2013, pp. 1461-1464 (Year: 2013).*

(Continued)

*Primary Examiner* — Shih Tsun A Chou
(74) *Attorney, Agent, or Firm* — MG-IP Law, P.C.

(57) ABSTRACT

Disclosed are examples of multiple bit magnetoresistive random access memory (MRAM) cells. A multiple bit MRAM cell may comprise a fixed layer, alternately stacked N tunnel barriers and N free layers, and a tunnel cap. N, which may represent number of bits of the MRAM cell, may be greater than or equal to two. Magnetic moment of the fixed layer may be fixed in one perpendicular direction. Magnetic moments of the free layers may be switchable from one to other perpendicular directions upon application of switch currents. The switch currents may be different for different layers. The magnetic moments of the free layers may be switched separately or otherwise independently of other free layers when the switch currents are applied separately.

21 Claims, 10 Drawing Sheets

(51) Int. Cl.
   *H10N 50/01* (2023.01)
   *H10N 50/10* (2023.01)
   *H10N 50/80* (2023.01)
   *H10N 50/85* (2023.01)

(52) U.S. Cl.
   CPC ............ *H10N 50/01* (2023.02); *H10N 50/10* (2023.02); *H10N 50/80* (2023.02); *H10N 50/85* (2023.02)

(56) References Cited

U.S. PATENT DOCUMENTS

| | | | |
|---|---|---|---|
| 2014/0048893 A1* | 2/2014 | Wu ........................ | H10N 50/85 257/E29.323 |
| 2020/0335145 A1* | 10/2020 | Jung ................... | G11C 11/4087 |
| 2021/0135091 A1* | 5/2021 | Park ....................... | H10B 61/00 |
| 2021/0376226 A1* | 12/2021 | Yuh ....................... | H10B 61/00 |

OTHER PUBLICATIONS

Miura, S., et al., "Scalability of Quad Interface p-MTJ for 1X nm STT-MRAM with 10 ns Low Power Write Operation, 10 years Retention and Endurance $10^{11}$", IEEE Transactions on Electron Devices, Oct. 2020, 2 Pages.

International Search Report and Written Opinion—PCT/US2022/071322—ISA/EPO—Jun. 30, 2022.

* cited by examiner

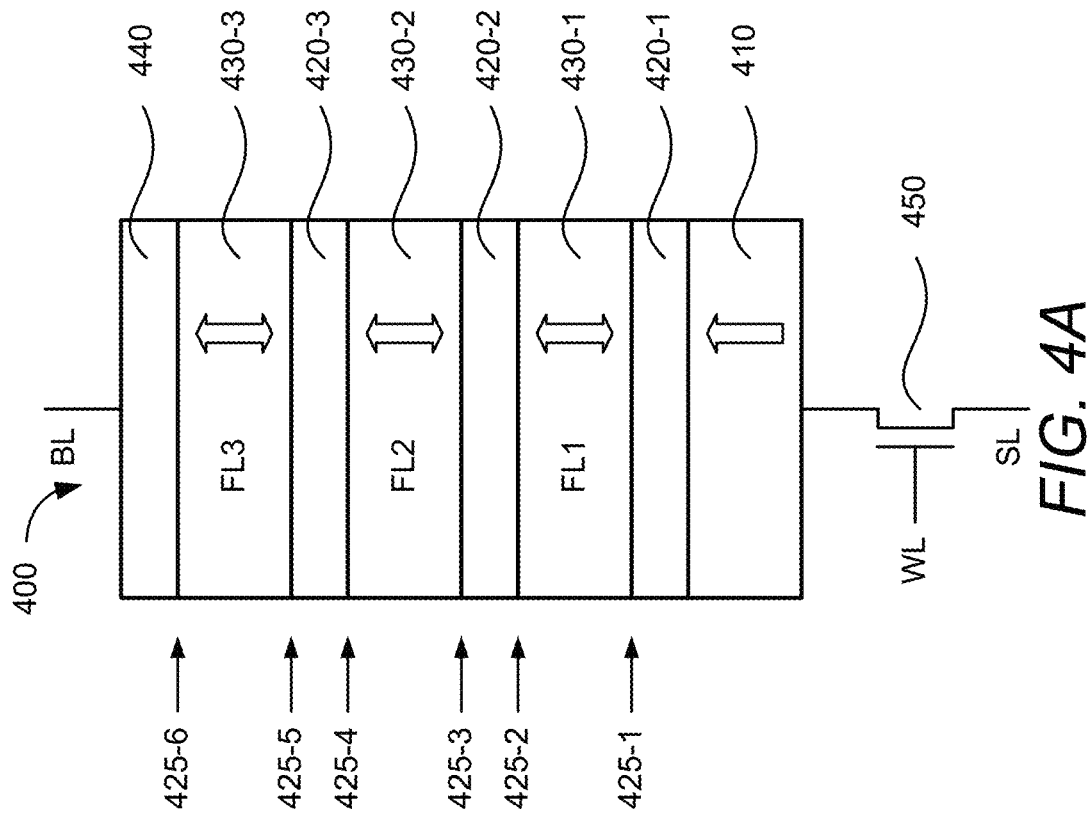

ONE TRANSISTOR ONE MAGNETIC TUNNEL JUNCTION MULTIPLE BIT MAGNETORESISTIVE RANDOM ACCESS MEMORY CELL

FIELD OF DISCLOSURE

This disclosure relates generally to memory, and more specifically, but not exclusively, to one transistor one magnetic tunnel junction (1T1J) multiple bit magnetoresistive random access memory (MRAM) cell.

BACKGROUND

MRAM is a type of memory that stores data magnetically. This is unlike semiconductor memories that store data as electric charges. MRAM typically uses a magnetic tunnel junction (MTJ) for data storage. MTJ is composed of a fixed or reference magnetic layer (or simply "fixed layer" or "reference layer"), a thin tunnel barrier (typically an oxide), and a free magnetic layer (or simply "free layer"). The state of the MTJ device is sensed by measuring the resistance. The MTJ has low resistance when the magnetic moment of the free layer parallels that of the fixed layer, and has high resistance when the magnetic moment of the free layer is antiparallel to that of the fixed layer.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary multiple bit magnetoresistive random access memory (MRAM) cell is disclosed. The multiple bit MRAM cell may comprise a fixed layer. The multiple bit MRAM cell may also comprise N tunnel barriers and N free layers formed on the fixed layer. N may be an integer greater than or equal to two. The N tunnel barriers and the N free layers may be alternately stacked on the fixed layer beginning with a first tunnel barrier being stacked on the fixed layer. The multiple bit MRAM cell may further comprise a tunnel cap formed on an Nth free layer. The fixed layer may comprise a magnet whose magnetic moment is fixed to one of a first perpendicular direction and a second perpendicular direction. The first and second perpendicular directions may respectively be first and second directions perpendicular to a plane defined by an upper surface of the fixed layer. Each free layer may comprise a magnet whose magnetic moment is switchable between the first and second perpendicular directions upon an application of a switch current of that free layer. The switch current of each free layer may be different from the switch currents of all other free layers.

An exemplary memory cell is disclosed. The memory cell may comprise a plurality of multiple bit magnetoresistive random access memory (MRAM) cells arranged in R rows and C columns. Each multiple bit MRAM cell may comprise a fixed layer. Each multiple bit MRAM cell may also comprise N tunnel barriers and N free layers formed on the fixed layer. N may be an integer greater than or equal to two. The N tunnel barriers and the N free layers may be alternately stacked on the fixed layer beginning with a first tunnel barrier being stacked on the fixed layer. Each multiple bit MRAM cell may further comprise a tunnel cap formed on an Nth free layer. The memory cell may also comprise a plurality of transistors correspondingly arranged in R rows and C columns such that for each transistor, a first connect of that transistor may be electrically coupled to the fixed layer of the corresponding multiple bit MRAM cell. The first connect may be one of a source or a drain of the transistor. The memory cell may further comprise a plurality of write lines (WL) corresponding to R rows such that for each row, the write line WL of that row r is electrically coupled to gates of all transistors of that row. The memory cell may yet comprise a plurality of bit lines (BL) corresponding to C columns such that for each column, the bit line BL of that column is electrically coupled to the tunnel caps of all multiple bit MRAM cells of that column. The memory cell may yet further comprise a plurality of source lines (SL) corresponding to C columns such that for each column, the source line SL of that column is electrically coupled to second connects of all transistors of that column. The second connect may be the other of the source or drain of the transistor. For each multiple bit MRAM cell, the fixed layer may comprise a magnet whose magnetic moment is fixed to one of a first perpendicular direction and a second perpendicular direction. The first and second perpendicular directions may respectively be first and second directions perpendicular to a plane defined by an upper surface of the fixed layer. Also for each multiple bit MRAM cell, each free layer may comprise a magnet whose magnetic moment is switchable between the first and second perpendicular directions upon an application of a switch current of that free layer. Further for each multiple bit MRAM cell, the switch current of each free layer may be different from the switch currents of all other free layers.

An example method of fabricating a multiple bit magnetoresistive random access memory (MRAM) cell is disclosed. The method may comprise forming a fixed layer. The method may also comprise forming N tunnel barriers and N free layers on the fixed layer. N may be an integer greater than or equal to two. The N tunnel barriers and the N free layers may be alternately stacked on the fixed layer beginning with a first tunnel barrier being stacked on the fixed layer. The method may further comprise forming a tunnel cap on an Nth free layer. The fixed layer may comprise a magnet whose magnetic moment is fixed to one of a first perpendicular direction and a second perpendicular direction. The first and second perpendicular directions may respectively be first and second directions perpendicular to a plane defined by an upper surface of the fixed layer. Each free layer may comprise a magnet whose magnetic moment is switchable between the first and second perpendicular directions upon an application of a switch current of that free layer. The switch current of each free layer may be different from the switch currents of all other free layers.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 4A and 4B illustrate an example of a three-bit MRAM cell and corresponding resistance states in accordance with one or more aspects of the disclosure.

Figure 1:
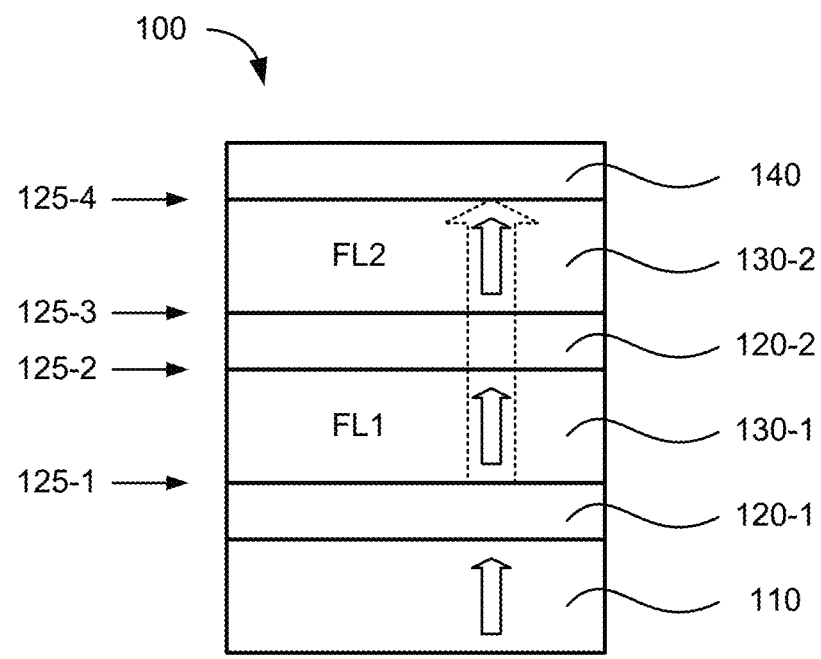
FIG. 1 illustrates an example of a conventional MRAM cell.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In accordance with various aspects herein, it is proposed to address issues associated with conventional MRAM cells. For context, an example of a conventional MRAM cell 100 is illustrated in FIG. 1. As seen, the conventional MRAM cell 100 includes a fixed layer 110, first and second tunnel barriers 120-1, 120-2 (collectively or individually 120), first and second free layers 130-1, 130-2 (collectively or individually 130), and a tunnel cap 140 all stacked together. As used herein, the term "fixed layer" may be used interchangeably with "reference layer".

The fixed layer 110, located at the bottom of the stack, is a ferromagnet layer with a magnetic moment oriented perpendicularly to a plane defined by an upper surface of the fixed layer 110. In this instance, the magnetic moment of the fixed layer 110 is shown as being oriented upwards. As the name implies, the magnetic moment of the fixed layer 110 is fixed.

The first and second free layers 130-1, 130-2 are also magnetic layers whose magnetic moments are also perpendicularly oriented as indicated by the dashed arrow. But unlike the fixed layer 110, the magnetic moments of the free layers 130 are switchable from being oriented upwards to downwards or vice versa upon an application of a switch current through the MRAM cell 100.

The first and second tunnel barriers 120-1, 120-2 (collectively or individually 120) are placed in between the fixed layer 110 and the first free layer 130-1 and in between the first free layer 130-1 and the second free layer 130-2, respectively. The tunnel barriers 120 are typically formed as thin oxides. The tunnel cap 140 formed on the second free layer 130-2 is also an oxide layer.

The conventional MRAM cell 100 is also referred to as a quad-MTJ cell due to the four magnet-barrier interfaces 125-1, 125-2, 125-3, 125-4 (collectively or individually 125). As an aside, relative to the so-called double-MTJ cell (not shown), the quad-MTJ cell has better thermal stability such that 10-year retention is possible even at very small dimensions (e.g., as small as 16 nm circle diameter (CD)). Also, quad-MTJ cells achieve sharp switching times.

Figure 2A:
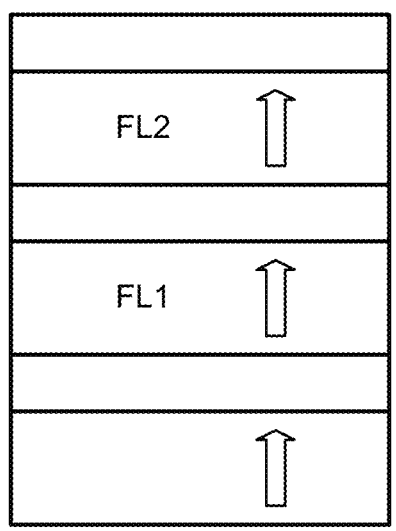
FIGS. 2A and 2B illustrate resistance states of the conventional MRAM cell.
Figure 2B:
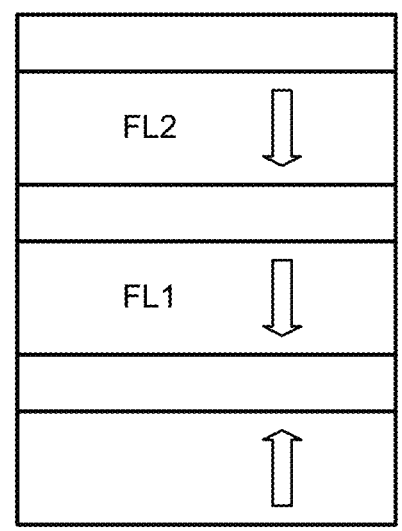

The resistance state of the MRAM cell 100 corresponds to the data stored in the MRAM cell 100. FIGS. 2A and 2B illustrate the resistance states of the MRAM cell 100. In these figures, component labels are omitted to reduce clutter. When the magnetic moments of the free layers 130 match that of the fixed layer 110 as seen in FIG. 2A, the MRAM cell 100 is in a low resistance state RL. On the other hand, when the magnetic moments of the free layers 130 are opposite that of the fixed layer 110 as seen in FIG. 2B, the MRAM cell 100 is in a high resistance state RH. The MRAM cell 100 is put in the RL or the RH state by applying a switch current—current that is sufficient to switch the magnetic moments of the free layers 130—through the MRAM cell 100.

However, note that the MRAM cell 100 stores only one bit of data. For example, RL may be interpreted as a logical '0' and RL may be interpreted as a logical '1'. This can be limiting when it comes to storage density.

To address this and/or other issues of conventional MRAM cells, a multiple bit MRAM cell—capable of storing multiple (e.g., two or more) bits—is proposed. To achieve this, it is generally proposed to fabricate or otherwise form MRAM cell with multiple (e.g., two or more) free layers in which the magnetic moments of some or all free layers are individually switchable. For example, when a current is applied through the proposed MRAM cell, magnetic moment of one free layer may switch but magnetic moment of another free layer may not.

If the magnetic moments of the free layers can be switched separately, this implies that there can be different combinations of free layers whose magnetic moments are oriented in a first perpendicular direction (e.g., upwards) and free layers whose magnetic moments are oriented in a second perpendicular direction (e.g., downwards). Since the resistances of a free layer can depend on the magnetic moment orientation of the layer, the number of resistance states of the proposed MRAM cell can correspondingly increase, e.g., may equal the number of different magnetic moment combinations.

To enable switching of the magnetic moments of the free layers individually, the switch current may be set to be different for different free layers. For example, in the proposed MRAM cell, assume that first and second free layers are respectively set with first and second switch currents that are different from each other. For example, the second switch current may be greater (i.e., stronger) than the first switch current. In this instance, when a current equal to the first switch current flows through the MRAM cell, the magnetic moment of the first free layer may switch (from upward to downwards or vice versa). However, the magnetic moment of the second free layer does not switch when the first switch current flows through the MRAM cell.

Figures 3A, 3B:
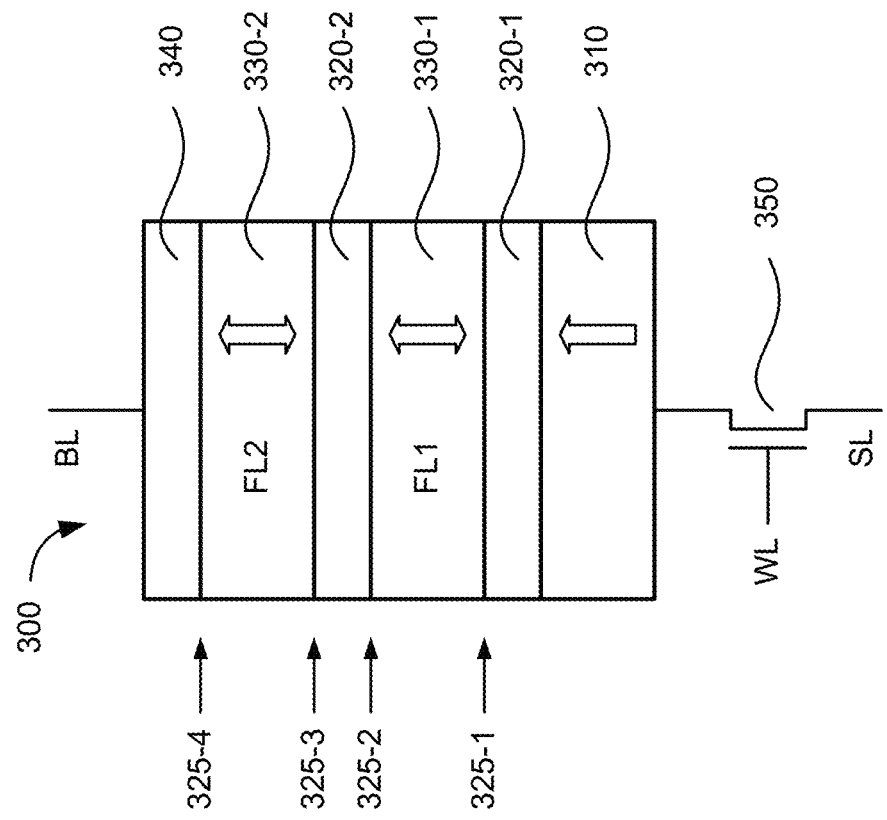
FIGS. 3A and 3B illustrate an example of a two-bit MRAM cell and corresponding resistance states in accordance with one or more aspects of the disclosure.

FIGS. 3A and 3B illustrate an example of a two-bit MRAM cell 300 and corresponding resistance states in accordance with one or more aspects of the disclosure. As seen, the MRAM cell 300 may comprise a fixed layer 310, first and second tunnel barriers 320-1, 320-2 (collectively or individually 320), first and second free layers 330-1, 330-2 (collectively or individually 330), and a tunnel cap 340 all stacked together. The tunnel barriers 320 and the free layers 330 may be alternately stacked on the fixed layer 310 beginning with the first tunnel barrier 320-1 stacked on the fixed layer 310. The tunnel cap 340 may be stacked on the second free layer 330-2.

In FIG. 3A, a transistor 350 is illustrated. Gate of the transistor 350 may be coupled to a word line (WL). A first connect (e.g., one of source or drain) of the transistor 350 may be coupled to the fixed layer 310, and a second connect (e.g., other of source or drain) of the transistor 350 may be coupled to a source line (SL). Also, a bit line (BL) may be coupled to the tunnel cap 340. When the transistor 350 is turned on (e.g., when an enable signal is applied to WL), then current may flow between BL and SL through the MRAM cell 300.

Note that the fixed layer 310, the alternating tunnel barriers 320 and free layers 330, and the tunnel cap 340 in that order may form a series connection. This means when current flows through the MRAM cell 300 between BL and SL, that same current flows through both the first and second free layers 330-1, 330-2.

The fixed layer 310 may be a ferromagnet layer with its magnetic moment oriented perpendicularly to a plane defined by an upper surface of the fixed layer 310. In this instance, the magnetic moment of the fixed layer 310 is shown as being oriented upwards. However, it is also possible that the magnetic moment may also be oriented downwards. As the name implies, the magnetic moment of the fixed layer 310 is fixed. That is, the magnetic moment of the fixed layer 310 may be fixed upward or downward.

As a generalization, the fixed layer 310 may comprise a magnet (e.g., cobalt (Co), iron (Fe), palladium (Pd), platinum (Pt), gadolinium (Gd), terbium (Tb), nickel (Ni), boron (B), etc.) whose magnetic moment is fixed to one of a first perpendicular direction (e.g., up) and a second perpendicular direction (e.g., down). The first and second perpendicular directions may respectively be first and second perpendicular directions perpendicular to a plane defined by the upper surface of the fixed layer 310.

Each of the first and second free layers 330-1, 330-2 may comprise a magnet (e.g., CoFeB, CoFe magnet) whose magnetic moment is switchable between the first and second perpendicular directions upon an application of a switch current of that free layer 330. In general, a switch current of a free layer 330 may be defined as a current through the free layer 330 sufficient to switch the magnetic moment of the free layer 330 from the first perpendicular direction to the second perpendicular direction or vice versa.

The switch current of each free layer 330 may be different from switch currents of other free layers 330. In the context of FIG. 3A, the first switch current $I_{FL1}$ (i.e., the switch current of the first free layer 330-1) may be different from the second switch current $I_{FL2}$ (i.e, the switch current of the second free layer 330-2). For example, the first switch current may be greater or weaker than the second switch current (i.e., $I_{FL1} > I_{FL2}$ or $I_{FL1} < I_{FL2}$). Then by separately applying first and second switch currents $I_{FL1}$, $I_{FL2}$, the magnetic moments of the first and second free layers 330-1, 330-2 can be separately set. This means that different magnetic moment combinations, and hence, different resistance states are possible for the MRAM cell 300.

FIG. 3B illustrates a table of possible magnetic moment orientation combinations of the first and second free layers 330-1, 330-2 and corresponding resistance states R0-R3. Note that a resistance of each free layer 330 may depend or otherwise be based on the magnetic moment of that free layer 330. For ease of reference, terms "first", "second", "fixed" may be prepended to characteristics of the components that make up the MRAM cell 300. That is, fixed, first, and second magnetic moments may respectively refer to the magnetic moments of the fixed layer 310, the first free layer 330-1, and the second free layer 330-2. Similarly, first and second resistances may respectively refer to the resistances of the first free layer 330-1 and the second free layer 330-2.

Going back to the table of FIG. 3B, for illustrative purposes, assume that the fixed magnetic moment is oriented in the first perpendicular direction (e.g., upward). As used herein, the term "fixed magnetic moment" may be interchangeably with "reference magnetic moment. Then the first resistance may be low (high) when the first magnetic moment is oriented in the first (second) perpendicular direction. Also, the second resistance may be low (high) when the second magnetic moment is oriented in the first (second) perpendicular direction. This indicates that the resistance state of the MRAM cell 300 can be based on a combination of first and second magnetic moments, i.e., based on a combination of magnetic moments of the first and second free layers 330-1, 330-2.

Resistance state R0—or simply state R0—may occur when the first and second magnetic moments are both oriented in the first perpendicular direction (e.g., up). In this instance, R0 may represent the state with the lowest resistance since both first and second magnetic moments are oriented in same direction as the fixed magnetic moment.

Progressing through the resistance states in the table of FIG. 3B, resistance state R1 may occur when the first magnetic moments is oriented in the second perpendicular direction (e.g., down) and the second magnetic moment remains oriented in the first perpendicular direction. In this state, the first resistance may be high (relative to low first resistance). R1 may represent a state with resistance that is greater than R0.

Resistance state R2 may occur when the first magnetic moments is oriented in the first perpendicular direction and the second magnetic moment is oriented in the second perpendicular direction. In this state, the second resistance may be high (relative to low second resistance). R2 may also represent a state with resistance that is greater than R0. Also, the resistance of R2 may be different from R1, e.g., R2>R1 or R2<R1.

Finally, resistance state R3 may occur when the first and second magnetic moments are both oriented in the second perpendicular direction. In this instance, R3 may represent the state with the highest resistance since both first and second magnetic moments are oriented in opposite direction as the fixed magnetic moment.

The following should be noted. The low first resistance (first resistance when the first and fixed magnetic moments are oriented in same direction) may be different from the low second resistance (second resistance when the second and fixed magnetic moments are oriented in same direction). Alternatively, or in addition thereto, the high first resistance (first resistance when the first and fixed magnetic moments are oriented in opposite directions) may be different from the high second resistance (second resistance when the second and fixed magnetic moments are oriented in opposite directions). In this way, the states R1 and R2 may be differentiated from each other.

Characteristics such as the resistances and switch currents of the free layers 330 may be set, controlled, or otherwise determined through the tunnel barriers 320, and also optionally through the tunnel cap 340. As seen in FIG. 3A, first, second, third, and fourth magnet-barrier interfaces 325-1, 325-2, 325-3, 325-4 (collectively or individually 325) indicating where the tunnel barriers 320 interface with free layers 330. One way (of which there may be several) to set the switch currents (first and/or second switch currents) and/or the resistances (e.g., first and/or second resistances) is to form the tunnel barriers 320 such that different perpendicular magnetic anisotropy (PMA) conditions are met at one or more of the magnet-barrier interfaces 325. To state it another way, the tunnel barriers 320 may be formed to meet the PMA conditions at the magnet-barrier interfaces 325 to set the switch current and/or the resistance of each free layer 330 to be different each other.

In an aspect, the tunnel barriers 320 and the tunnel cap 340 may be formed from crystalline oxide such as magnesium oxide (MgO) and aluminum oxide (AlO). The orientation of the lattice of the crystalline oxide can have a significant influence in the PMA condition. In this aspect, the tunnel barriers 320 may be formed in which the lattices of the crystalline oxide are oriented to meet the PMA conditions of corresponding magnet-barrier interfaces 325. For example, the lattice orientation of the first tunnel barrier 320-1 may be different from the lattice orientation of the second tunnel barrier 320-2 and/or from the lattice orientation of the tunnel cap 340.

The thicknesses of the tunnel barriers 320 can also influence the PMA conditions at the magnet-barrier interfaces 325. Thus, alternatively or in addition to controlling the lattice orientations of the tunnel barriers 320, the thicknesses of the tunnel barriers 320 may also be controlled to have the proper PMA conditions met. In other words, the tunnel barriers 320 may be formed to have thicknesses to meet the PMA conditions of corresponding magnet-barrier interfaces 325. For example, the thickness of the first tunnel barrier 320-1 may be different from the thickness of the second tunnel barrier 320-2 and/or from the thickness of the tunnel cap 340.

A further way to influence the characteristics of the free layers 330 is through the free layers 330 themselves. For example, recall that the free layers 330 may be formed as CoFeB or CoFe layers. In an aspect, the relative composition of Co, Fe, and B of the different free layers 330 may be different. As an illustration, one free layer 330 may have 20% Co while another free layer 330 may have 30% Co.

The concepts described herein can be expanded to more than two bits as demonstrated in FIGS. 4A and 4B illustrating an example of a three-bit MRAM cell 400 and corresponding resistance states in accordance with one or more aspects of the disclosure. As seen, the MRAM cell 400 may comprise a fixed layer 410, first, second and third tunnel barriers 420-1, 420-2, 420-3 (collectively or individually 420), first, second and third free layers 430-1, 430-2, 430-3 (collectively or individually 430), and a tunnel cap 440 all stacked together. The tunnel barriers 420 and the free layers 430 may be alternately stacked on the fixed layer 410 beginning with the first tunnel barrier 420-1 stacked on the fixed layer 410. The tunnel cap 440 may be stacked on the third free layer 430-3.

In FIG. 4A, a transistor 450 is illustrated. Gate of the transistor 450 may be coupled to a word line (WL). A first connect (e.g., one of source or drain) of the transistor 450 may be coupled to the fixed layer 410, and a second connect (e.g., other of source or drain) of the transistor 450 may be coupled to a source line (SL). Also, a bit line (BL) may be coupled to the tunnel cap 440. When the transistor 450 is turned on (e.g., when an enable signal is applied to WL), then current may flow between BL and SL through the MRAM cell 400.

Again, the fixed layer 410, the alternating tunnel barriers 420 and free layers 430, and the tunnel cap 440 in that order may form a series connection. This means when current passes through the MRAM cell 400 between BL and SL or in reverse direction, that same current flows through all three free layers 430-1, 430-2, 430-3. The makeup of the fixed layer 410 and the free layers 430 may be similar to the fixed layer 310 and the free layers 330 of FIG. 3. Thus, the details will not be repeated other than to note that the compositions of the free layers 430 may be varied, e.g., to meet the PMA conditions at the magnet-barrier interfaces 425-1, 425-2, 425-3, 425-4, 425-5, 425-6 (collectively or individually 425). The makeup of the tunnel barriers 420 may likewise be similar to the tunnel barriers 320 of FIG. 3, and thus the details will not be repeated here other than to indicate that the lattices and or the thicknesses of the tunnel barriers may be formed to meet the to meet the PMA conditions at the magnet-barrier interfaces 425 to set the resistances and/or the switch currents of the free layers 430.

The PMA conditions may be set such that the first, second and third switch currents $I_{FL1}$, $I_{FL2}$, $I_{FL3}$—the switch currents of the first, second, and third free layers 430-1, 430-2, 430-3, respectively, are different from each other. For example, the switch currents may increase or decrease in order of the free layers 430, i.e., $I_{FL1} > I_{FL2} > I_{FL3}$ or $I_{FL1} < I_{FL2} < I_{FL3}$ are possible. Of course, other possibilities are also contemplated, e.g., $I_{FL1}>I_{FL3}>I_{FL2}$ or $I_{FL1}<I_{FL3}<I_{FL2}$ or $I_{FL3}>I_{FL1}>I_{FL2}$ or $I_{FL3}<I_{FL1}<I_{FL3}$ are also possible.

FIG. 4B illustrates a table of possible magnetic moment orientation combinations of the first, second and third free layers 430-1, 430-2, 430-3 and corresponding resistance states R0-R7. Again, a resistance of each free layer 430 may depend or otherwise be based on the magnetic moment of that free layer 430. Again assuming that the fixed magnetic moment (magnetic moment of the fixed layer is oriented in the first perpendicular direction (e.g., upward)), then R0 may represent the state with the lowest resistance with each successive state representing increased resistance such that R7 represents the state with the highest resistance.

Also again, the low resistance of each free layer 430 (resistance when the magnetic moment of that free layer 430 is oriented in the first perpendicular direction) may be different from the low resistances of other free layers 430. Alternatively or in addition thereto, the high resistance of each free layer 430 (resistance when the magnetic moment of that free layer 430 is oriented in the second perpendicular direction) may be different from the high resistances of other free layers 430. This enables all of the states R0-R7 to have distinguishable resistances.

It is indicated above that the magnetic moment of at least one free layer 330, 430 may be settable independent of the magnetic moments of other free layers 330, 430 upon application of the switch current of the at least one free layer 330, 430. Then by applying switch currents separately, multiple bits may be stored in the MRAM cell 300, 400.

FIGS. 5A-5D illustrate a process in which multiple bit data may be written to a multiple bit MRAM cell. In these figures, the two-bit MRAM cell 300 of FIG. 3 will be used for demonstration. Component labels are omitted in these figures to reduce clutter. Also, it is assumed that the first switch current $I_{FL1}$ is less than the second switch current $I_{FL2}$, i.e., $I_{FL1}<I_{FL2}$.

Figures 5A, 5B:
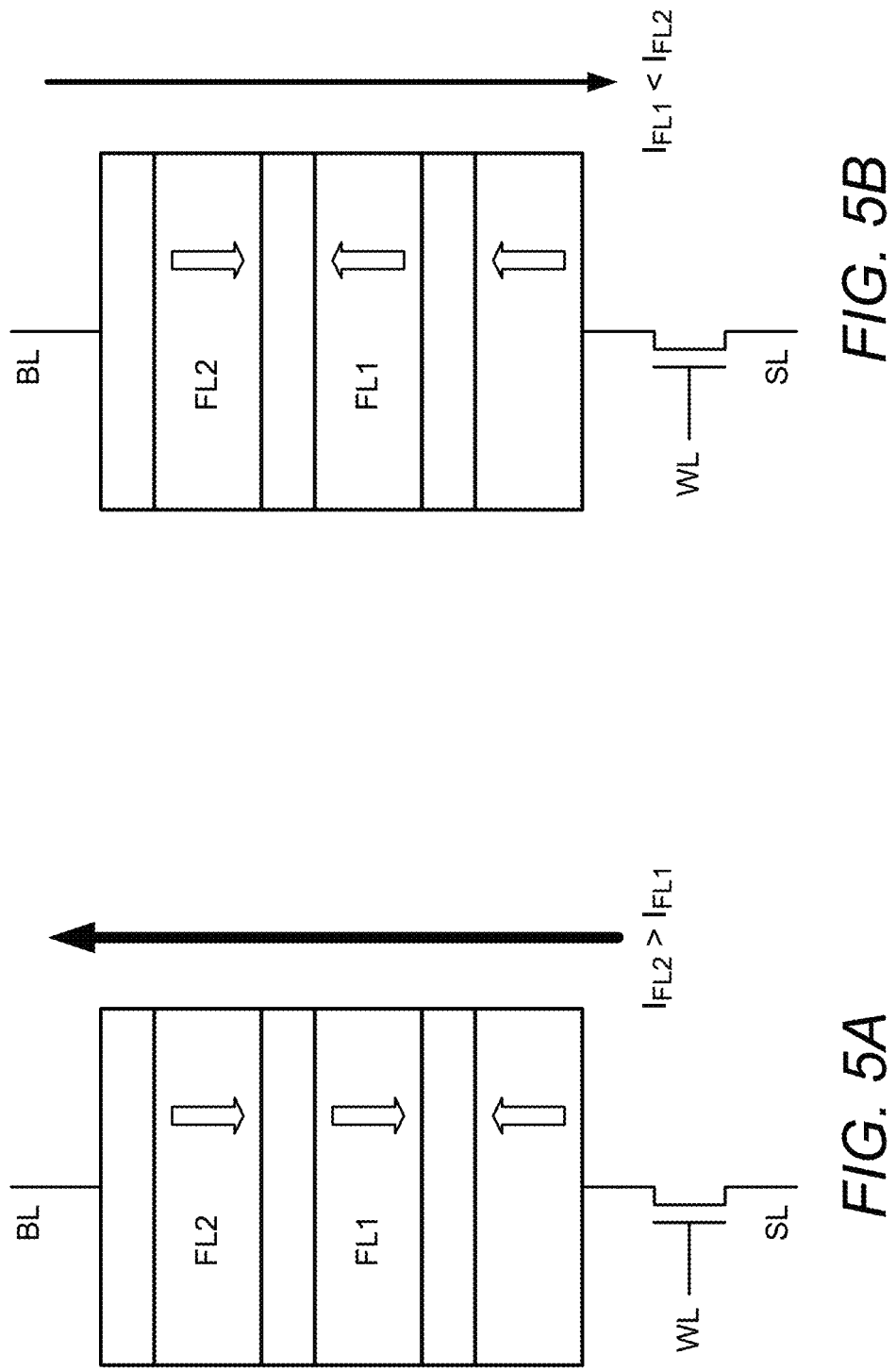
FIGS. 5A-5D illustrate example ways of applying currents for writing data in a multiple bit MRAM cell in accordance with one or more aspects of the disclosure.

FIG. 5A illustrates a scenario in which a write current greater than or equal to the switch current of the second free layer is made to flow through the MRAM cell. For example, an enable signal may be applied to the gate of the transistor through the word line (WL). For simplicity, this may be described as applying the second switch current $I_{FL2}$ through the MRAM cell. Since the second switch current $I_{FL2}$ is the bigger of the two switch currents, it is represented as a thick line.

Note the direction of the second switch current $I_{FL2}$. In this instance, the second switch current $I_{FL2}$ is shown as flowing from the source line (SL) to the bit line (BL) through the MRAM cell. It is assumed that write current flowing from SL to BL, or more particularly from the fixed layer to the tunnel cap, will switch the magnetic moment of a free layer from the first perpendicular direction (e.g., up) to the second perpendicular direction (e.g., down) if the magnitude of the write current is at or greater than the switch current of the free layer. Conversely, a write current flowing from BL to SL, or more particularly from the tunnel cap to the fixed layer, will switch the magnetic moment of a free layer from the second perpendicular direction to the first perpendicular direction if the magnitude of the write current is at or greater than the switch current of the free layer.

In FIG. 5A, after the second switch current $I_{FL2}$ is made to flow through the second free layer, the second magnetic moment may be oriented in the second perpendicular direction. Since $I_{FL2}>I_{FL1}$, the first magnetic moment may also be oriented in the second perpendicular direction. Thus, the MRAM cell may be put into R3 (11) resistance state (see FIG. 3B).

FIG. 5B illustrates a scenario in which a write current less than the switch current of the second free layer but greater than or equal to the switch current of the first free layer is made to flow through the MRAM cell. For simplicity, this may be described as applying the first switch current $I_{FL1}$ through the MRAM cell. Since the first switch current $I_{FL1}$ is the smaller of the two switch currents, it is represented as a thinner line.

This time, the first switch current $I_{FL1}$ is illustrated as flowing from BL to SL. Thus, the magnetic moment of the first free layer may switch to the first perpendicular direction. However, since $I_{FL1}<I_{FL2}$, the magnetic moment of the second free layer remains oriented in the second perpendicular direction. Thus, the MRAM cell may be put into R2 (10) resistance state from R3 (11) resistance state (see FIG. 3B).

Figure 5D:
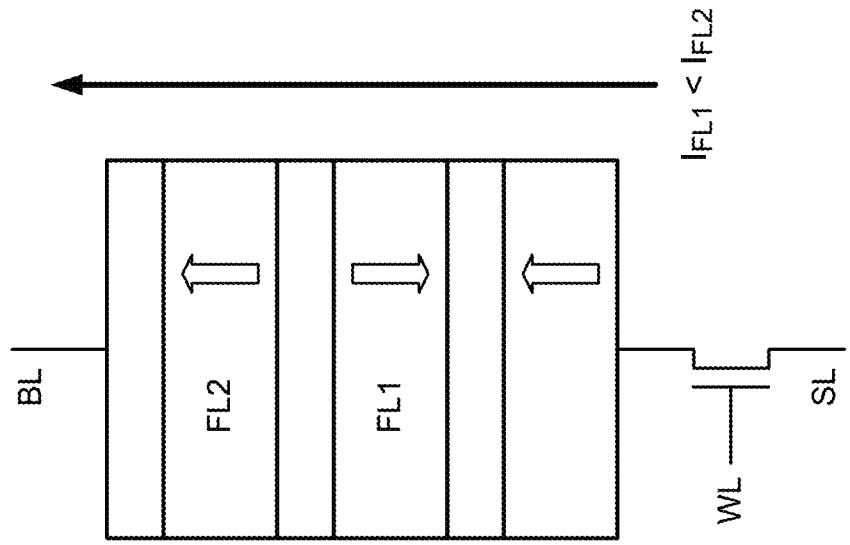
Figure 5C:
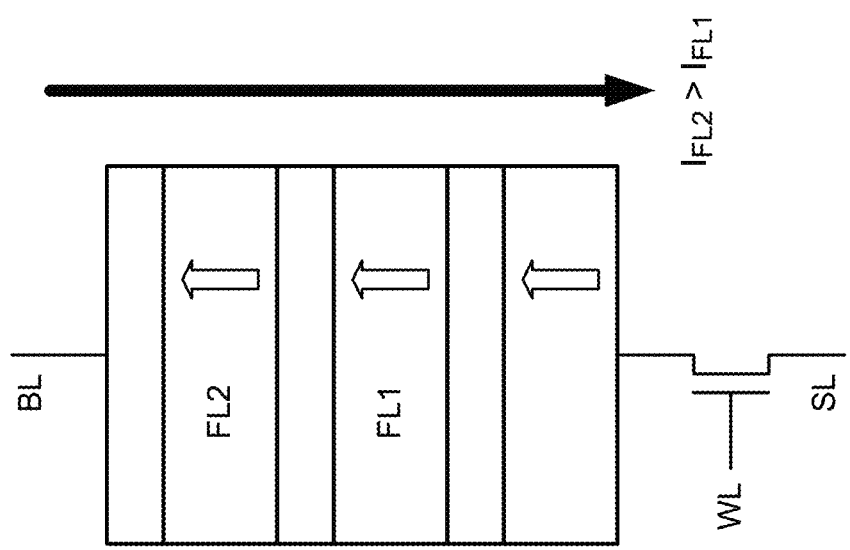

FIG. 5C illustrates a scenario in which a write current greater than or equal to the switch current of the second free layer is made to flow through the MRAM cell, but this time from BL to SL. That is, second switch current $I_{FL2}$ is applied through the MRAM cell from the tunnel cap to the fixed layer. Thus, the magnetic moment of the second free layer may be switched from the second perpendicular direction to the first perpendicular direction. The magnetic moment of the first free layer remains in the first perpendicular direction. Thus, the MRAM cell may be put into R0 (00) resistance state from R2 (10) resistance state (see FIG. 3B).

FIG. 5D illustrates a scenario in which a write current less than the switch current of the second free layer but greater than or equal to the switch current of the first free layer is made to flow, this time from SL to BL through the MRAM cell. That is, first switch current $I_{FL1}$ is applied through the MRAM cell from the tunnel cap to the fixed layer. Thus, the magnetic moment of the first free layer may be switched from the first perpendicular direction to the second perpendicular direction. The magnetic moment of the second free layer remains in the second perpendicular direction. Thus, the MRAM cell may be put into R1 (01) resistance state from R0 (00) resistance state (see FIG. 3B).

Figure 6:
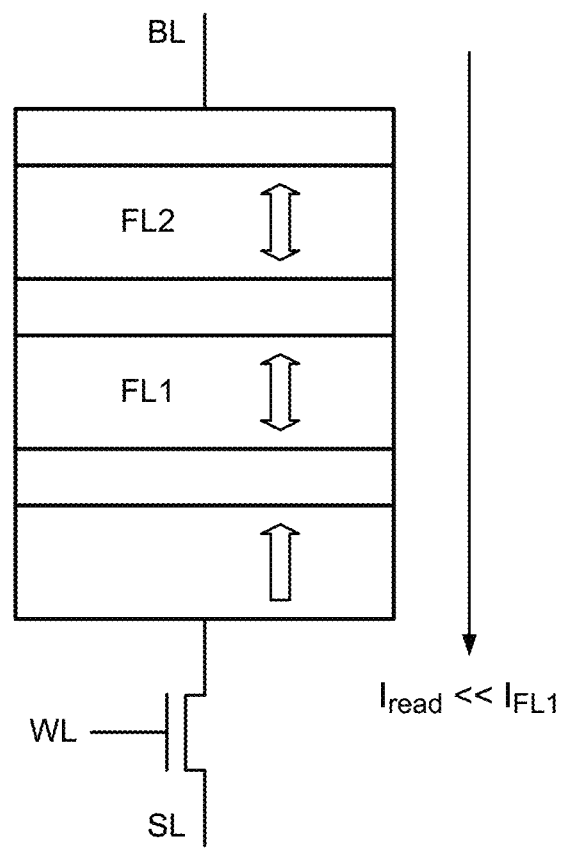
FIG. 6 illustrates an example way of applying currents for reading data in a multiple bit MRAM cell in accordance with one or more aspects of the disclosure.

FIG. 6 illustrates an example way of applying currents for reading data in a multiple bit MRAM cell in accordance with one or more aspects of the disclosure. Again, the two-bit MRAM cell 300 of FIG. 3 will be used for demonstration. Also again, component labels are omitted to reduce clutter. As seen, a read current $I_{read}$ that is smaller—preferably much smaller—than the smallest of the switch currents may be applied, i.e., $I_{read} \ll I_{FL1}$ may be applied to sense the resistance state of the MRAM cell. Since the read current $I_{read}$ is small, none of the magnetic moments will be switched. That is, the reading may be non-destructive.

Figure 7:
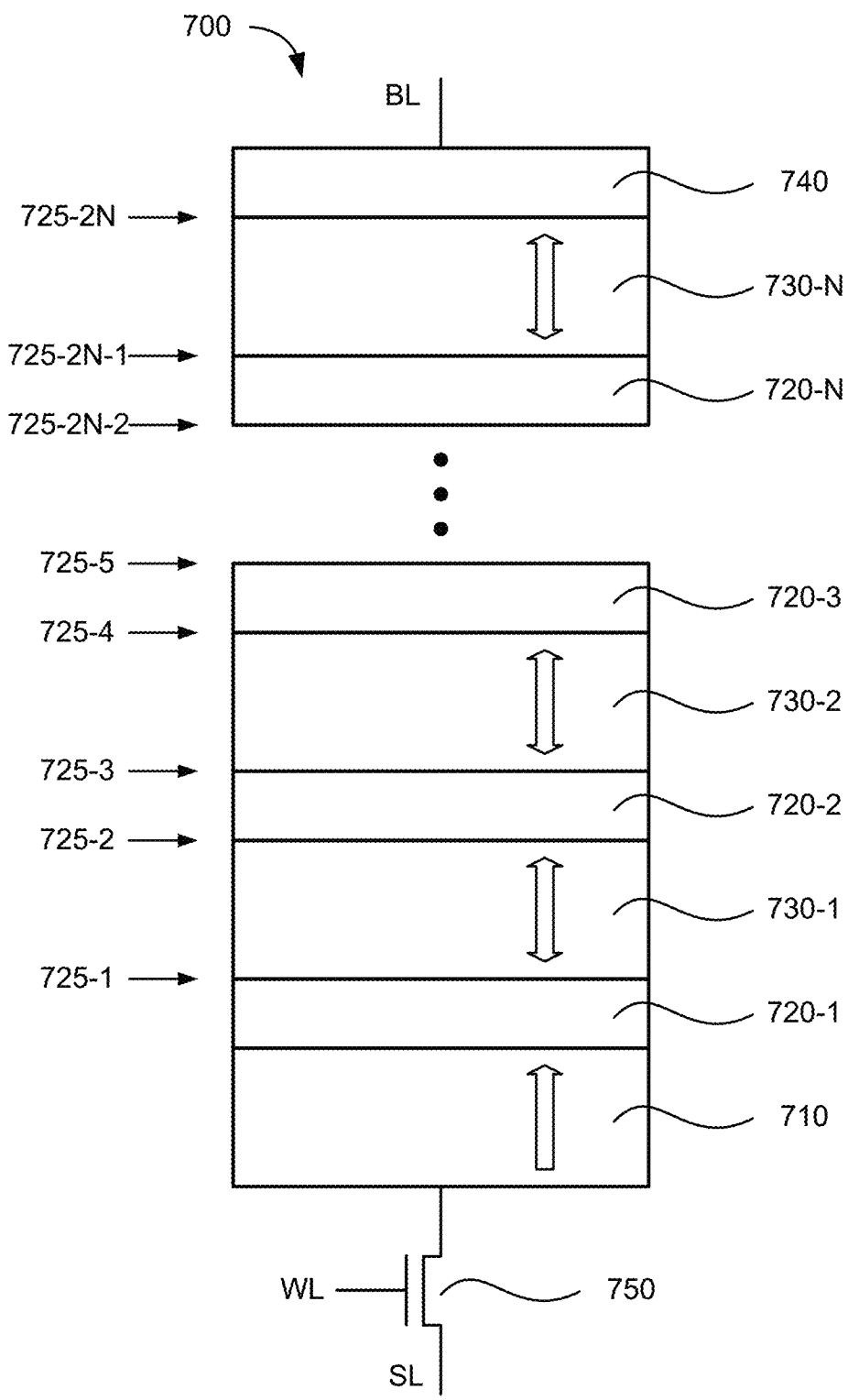
FIG. 7 illustrates an example of a multiple bit MRAM cell in accordance with one or more aspects of the disclosure.

Recall that the concepts described herein can be expanded to more than two bits as demonstrated. Indeed, the concepts can be generalized to any number of bits. Various design consideration may determine how may bits that an MRAM cell may store. FIG. 7 illustrates an example of a generalized multiple bit MRAM cell 700 in accordance with one or more aspects of the disclosure. The generalized MRAM cell 700 may comprise a fixed layer 710, N tunnel barriers 720, N free layers 730, and a tunnel cap 740 all stacked together. N may be an integer greater than or equal to two. A transistor may be electrically coupled to the fixed layer 710.

The N tunnel barriers 720 and the N free layers 730 may be alternately stacked on the fixed layer 710 beginning with the first tunnel barrier 720-1 stacked on the fixed layer 710.

The tunnel cap 740 may be stacked on the Nth free layer 730-*n*. In an aspect, the fixed layer 710, the alternating N tunnel barriers 720 and N free layers 730, and the tunnel cap 740 in that order may form a series connection.

The fixed layer 710 may comprise a magnet (e.g., CoFeB, CoFe, Co/Pd or Co/Pt or Co/Fe multilayers) whose magnetic moment is fixed to one of a first perpendicular direction and a second perpendicular direction. The first and second perpendicular directions may respectively be first and second perpendicular directions perpendicular to a plane defined by the upper surface of the fixed layer 710.

Each free layer 730-*n*, n=1 ... N, may comprises a magnet whose magnetic moment is switchable between the first and second perpendicular directions upon an application of a switch current of that free layer 730-*n*. Generally, a switch current of a free layer 730 may be viewed as a current through the free layer 730 sufficient to switch the magnetic moment of the free layer 730 from the first perpendicular direction to the second perpendicular direction or vice versa. The switch current of each free layer 730-*n* may be different from the switch currents of all other free layers 730. The magnetic moments of at least one free layer 730, may be settable independent of the magnetic moments of the other free layers 730 upon the application of the switch current of the at least one free layer 730 through the MRAM cell 700.

A resistance of each free layer 730-*n* may be based on the magnetic moment of that free layer 730-*n*. As such, the resistance state of the multiple bit MRAM cell 700 may be determine or otherwise based on a combination of magnetic moments of the N free layers 730. The MRAM cell 700 may be configured to be in any one of $2^N$ resistance states. A resistance of each resistance state may be different from resistances of all other resistance states.

The MRAM cell 700 may comprises a plurality of magnet-barrier interfaces 725. Each magnet-barrier interface 725-*i*, i=1 ... 2N−1 may be defined where one of the free layers 730 interfaces with one of the tunnel barriers 720. Where the free layer 730-N interfaces with the tunnel cap 740 may also be considered to be a magnet-barrier interface 725-2N.

The N tunnel barriers 720 may be formed to meet the PMA conditions at the plurality of magnet-barrier interfaces 725 to set the switch current of each free layer 730 to be different each other. For example, if any of the tunnel barriers 720 are formed from crystalline oxides (e.g., MgO), then the lattices of the tunnel barriers 720 may be oriented so as to meet the PMA conditions of corresponding magnet-barrier interfaces 725. Thus, in an aspect, lattice orientations of two or more tunnel barriers 720 may be different from each other.

Alternatively or in addition thereto, the thicknesses of the one or more tunnel barriers 720 may be formed to have thicknesses so as to meet the PMA condition of corresponding magnet-barrier interfaces 725. Thus, in an aspect, the thicknesses of two or more tunnel barriers 720 may be different from each other.

Figure 8:
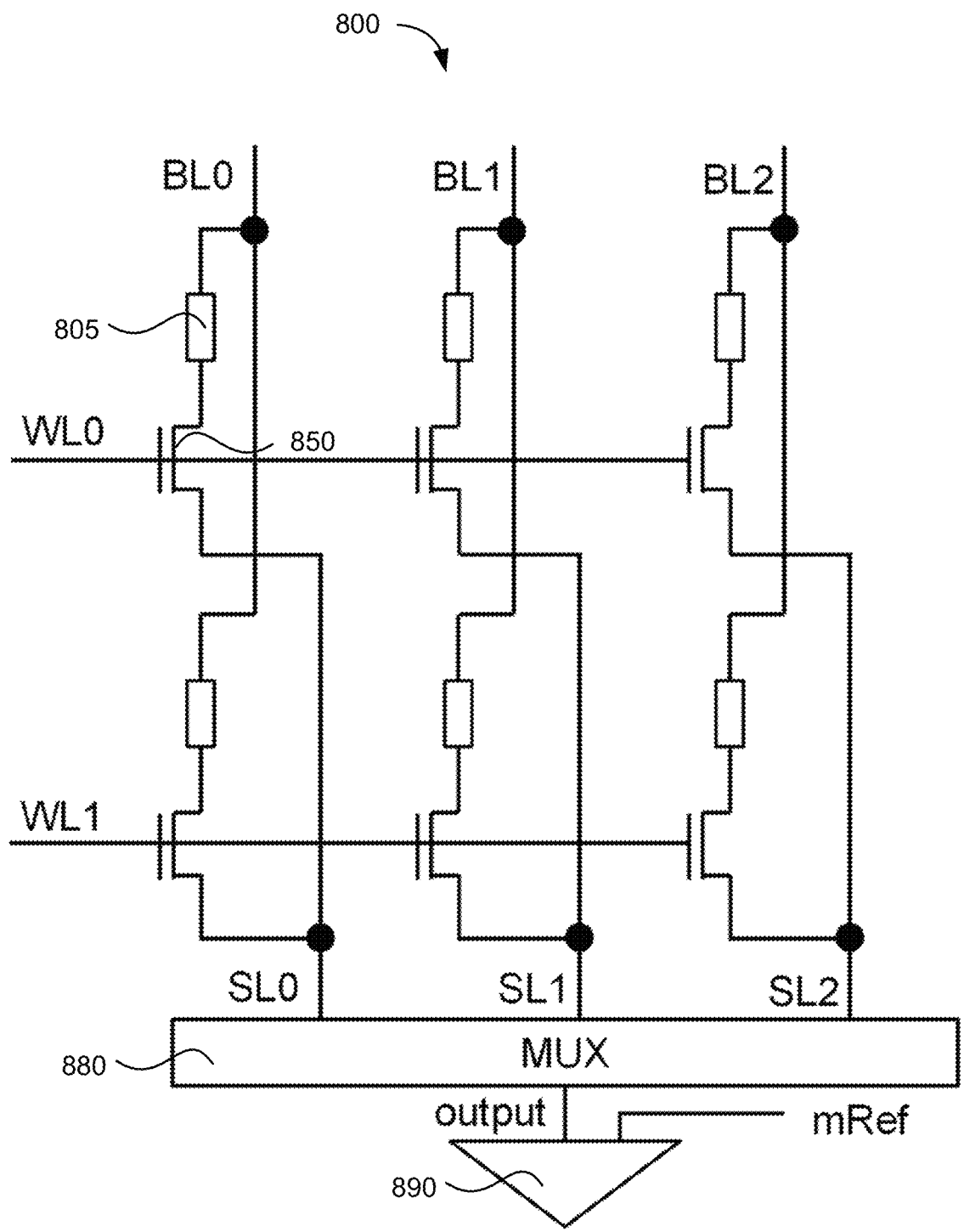
FIG. 8 illustrates an example memory cell array of multiple bit MRAM cells in accordance with one or more aspects of the disclosure.

FIG. 8 illustrates an example memory cell array 800 of multiple bit MRAM cells in accordance with one or more aspects of the disclosure. The memory cell 800 may comprise a plurality of MRAM cells 805 arranged in R rows and C columns. Each MRAM cell may be any of the MRAM cells 300, 400, 700 illustrated in FIGS. 3A, 4A, and 7.

The memory cell 800 may also comprise a plurality of transistors 850, a plurality of word lines (WL), a plurality of bit lines (BL), and a plurality of source lines (SL). The plurality of transistors may also be arranged in R rows and C columns corresponding to the plurality of MRAM cells 805 such that for each transistor (r, c) 850, r=0 ... R−1, c=0 ... C−1, a first connect of the transistor (r, c) may be electrically coupled to the fixed layer 310, 410, 710 of the corresponding multiple bit MRAM cell (r, c). The first connect may be one of a source or a drain of the transistor (r, c) 850.

The plurality of word lines may correspond to R rows such that for each row r=$r_k$, the word line WL(r=$r_k$) of that row r=$r_k$ may be electrically coupled to gates of all transistors (r=$r_k$, c) 850 of that row r=$r_k$. The plurality of bit lines may correspond to C columns such that for each column c=$c_j$, the bit line BL(c=$c_j$) of that column c=$c_j$ may be electrically coupled to the tunnel caps 340, 440, 740 of all MRAM cells (r, c=$c_j$) 850 of that column c=$c_j$. The plurality of source lines (SL) may correspond to C columns such that for each column c=$c_j$, the source line SL(c=$c_j$) of that column c=$c_j$ may be electrically coupled to second connects of all transistors (r, c=$c_j$) 850 of that column c=$c_j$. The second connect may be being the other of the source or drain of the transistor (r, c) 850.

The memory cell 800 may further comprise a multiplexor (MUX) 880 and a sense amplifier (SA) 890. The MUX 880 may be configured to select one of the plurality of source lines. The SA 890 may be configured to sense a resistance state of on the source line selected by the MUX 880.

Figure 9:
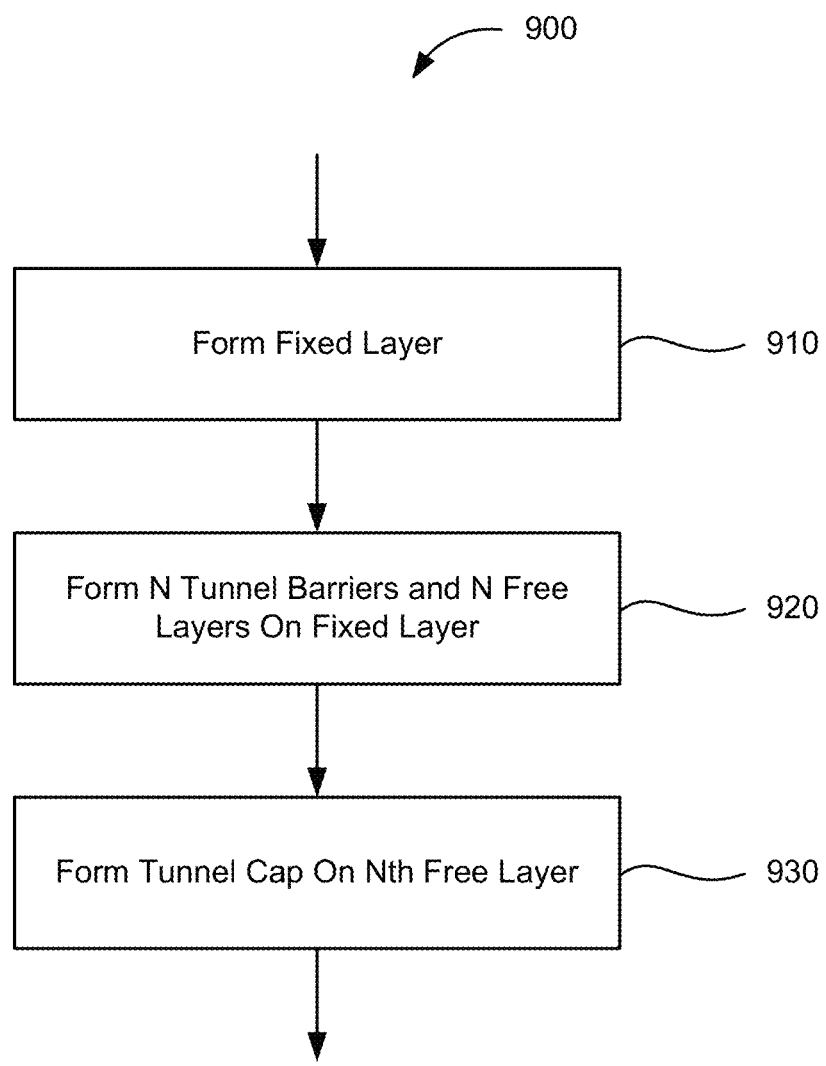
FIG. 9 illustrates a flow chart of an example method of fabricating a multiple bit MRAM cell in accordance with one or more aspects of the disclosure.

FIG. 9 illustrates a flow chart of an example method 900 of fabricating an MRAM cell such as any of the MRAM cells 300, 400, 700. In block 910, a fixed layer (e.g., any of fixed layers 310, 410, 710) may be formed.

In block 920, N tunnel barriers (e.g., any of tunnel barriers 320, 420, 720) and N free layers (e.g., any of free layers 330, 430, 730) may be formed on the on the fixed layer. N may be an integer greater than or equal to two. The N tunnel barriers and the N free layers may be alternately stacked on the fixed layer beginning with a first tunnel barrier (e.g., any of tunnel barriers 320-1, 420-1, 720-1) being stacked on the fixed layer.

In block 930, a tunnel cap (e.g., any of tunnel caps 340, 440, 740) may be formed on the Nth free layer (e.g., any of the free layers 330-2, 430-3, 730-N).

The fixed layers, the tunnel barriers, the free layers, and the tunnel caps have been discussed in detail above. Thus, they are not repeated here for conciseness.

Figure 10:
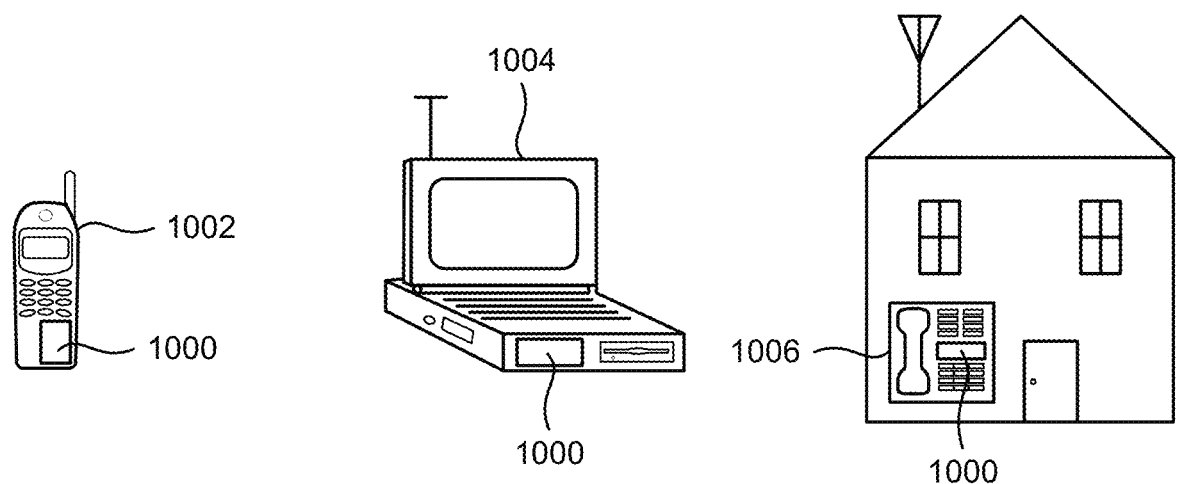
FIG. 10 illustrates various electronic devices which may utilize one or more aspects of the disclosure.

FIG. 10 illustrates various electronic devices that may be integrated with any of the aforementioned MRAM cells and MRAM cell arrays 300, 400, 700, 800 in accordance with various aspects of the disclosure. For example, a mobile phone device 1002, a laptop computer device 1004, and a fixed location terminal device 1006 may each be considered generally as user equipment (UE) and may include an apparatus 1000 that incorporates the MRAM cells and arrays 300, 400, 700, 800 as described herein. The devices 1002, 1004, 1006 illustrated in FIG. 10 are merely exemplary. Other electronic devices may also include the MRAM cells and arrays 300, 400, 700, 800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles, an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged as described herein.

Implementation examples are described in the following numbered clauses:

Clause 1: A multiple bit magnetoresistive random access memory (MRAM) cell, comprising: a fixed layer; N tunnel barriers and N free layers formed on the fixed layer, N being an integer greater than or equal to two, the N tunnel barriers and the N free layers being alternately stacked on the fixed layer beginning with a first tunnel barrier being stacked on the fixed layer; and a tunnel cap formed on an Nth free layer, wherein the fixed layer comprises a magnet whose magnetic moment is fixed to one of a first perpendicular direction and a second perpendicular direction, the first and second perpendicular directions respectively being first and second directions perpendicular to a plane defined by an upper surface of the fixed layer, wherein each free layer comprises a magnet whose magnetic moment is switchable between the first and second perpendicular directions upon an application of a switch current of that free layer, and wherein the switch current of each free layer is different from the switch currents of all other free layers.

Clause 2: The multiple bit MRAM cell of Clause 1, wherein the fixed layer, the alternating N tunnel barriers and N free layers, and the tunnel cap in that order form a series connection.

Clause 3: The multiple bit MRAM cell of any of Clauses 1-2, wherein the multiple bit MRAM cell is configured to be in any one of $2^N$ resistance states, a resistance of each resistance state being different from resistances of all other resistance states.

Clause 4: The multiple bit MRAM cell of Clause 3, wherein a resistance of each free layer is based on the magnetic moment of that free layer such that the resistance state of the multiple bit MRAM cell is based on a combination of magnetic moments of the N free layers.

Clause 5: The multiple bit MRAM cell of any of Clauses 1-4, wherein the multiple bit MRAM cell comprises a plurality of magnet-barrier interfaces, each magnet-barrier interface being defined where one of the N free layers interface with one of the N tunnel barriers, and wherein the N tunnel barriers are formed to meet perpendicular magnetic anisotropy (PMA) conditions at the plurality of magnet-barrier interfaces to set the switch current of each free layer to be different from each other.

Clause 6: The multiple bit MRAM cell of Clause 5, wherein at least one tunnel barrier is formed from a crystalline oxide in which a lattice of the crystalline oxide is oriented so as to meet the PMA condition of a corresponding magnet-barrier interface.

Clause 7: The multiple bit MRAM cell of Clause 6, wherein the at least one tunnel barrier is formed from magnesium oxide (MgO).

Clause 8: The multiple bit MRAM cell of Clause 5, wherein at least one tunnel barrier is formed to have a thickness so as to meet the PMA condition of a corresponding magnet-barrier interface.

Clause 9: The multiple bit MRAM cell of Clause 8, wherein the thicknesses of at least two tunnel barriers are different.

Clause 10: The multiple bit MRAM cell of any of Clauses 1-9, wherein at least one free layer is a ferromagnet formed from at least one of cobalt (Co), iron (Fe), palladium (Pd), platinum (Pt), gadolinium (Gd), Terbium (Tb), nickel (Ni), and boron (B).

Clause 11: The multiple bit MRAM cell of Clause 10, wherein for at least two free layers formed from CoFeB, a relative composition of Co, Fe, and B are different.

Clause 12: The multiple bit MRAM cell of any of Clauses 1-11, wherein for at least one free layer, the magnetic moment of the at least one free layer is settable independent of the magnetic moments of the other free layers upon the application of the switch current of the at least one free layer.

Clause 13: The multiple bit MRAM cell of any of Clauses 1-12, wherein N=2 such that the N tunnel barriers comprise first and second tunnel barriers and the N free layers comprise first and second free layers in which the first tunnel barrier is formed on the fixed layer, the first free layer is formed on the first tunnel barrier, the second tunnel barrier is formed on the first free layer, the second free layer is formed on the second tunnel barrier, and the tunnel cap is formed on the second free layer.

Clause 14: The multiple bit MRAM cell of Clause 13, wherein first and second switch currents are switch currents of the first and second free layers, respectively, and first and second magnetic moments are magnetic moments of the first and second free layers, and wherein the multiple bit MRAM cell is configured such that the first magnetic moment switches independently of the second magnetic moment upon an application of the first switch current, or the second magnetic moment switches independently of the first magnetic moment upon an application of the second switch current, or both.

Clause 15: The multiple bit MRAM cell of any of Clauses 13-14, wherein the first and second tunnel barriers are formed from crystalline magnesium oxide (MgO) such that lattices of the first and second tunnel barriers are different, or thicknesses of the first and second tunnel barriers are different, or both.

Clause 16: The multiple bit MRAM cell of any of Clauses 1-12, wherein N=3 such that the N tunnel barriers comprise first, second, and third tunnel barriers and the N free layers comprise first, second, and third free layers in which the first tunnel barrier is formed on the fixed layer, the first free layer is formed on the first tunnel barrier, the second tunnel barrier is formed on the first free layer, the second free layer is formed on the second tunnel barrier, the third tunnel barrier is formed on the second free layer, the third free layer is formed on the third tunnel barrier, and the tunnel cap is formed on the third free layer.

Clause 17: The multiple bit MRAM cell of Clause 16, wherein first, second, and third switch currents are switch currents of the first, second, and third free layers, respectively, and first, second, and third magnetic moments are magnetic moments of the first, second, and third free layers, and wherein the multiple bit MRAM cell is configured such that, the first magnetic moment switches independently of the second and third magnetic moments upon an application of the first switch current, or the second magnetic moment switches independently of the first and third magnetic moments upon an application of the second switch current, or the third magnetic moment switches independently of the first and second magnetic moments upon an application of the third switch current, or any combination thereof.

Clause 18: The multiple bit MRAM cell of any of Clauses 16-17, wherein the first, second, and third tunnel barriers are formed from crystalline magnesium oxide (MgO) such that lattices of the first, second, and third tunnel barriers are different, or thicknesses of the first, second, and third tunnel barriers are different, or both.

Clause 19: The multiple bit MRAM cell of any of Clauses 1-18, wherein the multiple bit MRAM cell is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 20: A memory cell array, comprising: a plurality of multiple bit magnetoresistive random access memory (MRAM) cells arranged in R rows and C columns, each multiple bit MRAM cell comprising: a fixed layer; N tunnel barriers and N free layers formed on the fixed layer, N being an integer greater than or equal to two, the N tunnel barriers and the N free layers being alternately stacked on the fixed layer beginning with a first tunnel barrier being stacked on the fixed layer; and a tunnel cap formed on an Nth free layer; a plurality of transistors correspondingly arranged in R rows and C columns such that for each transistor, a first connect of that transistor is electrically coupled to the fixed layer of the corresponding multiple bit MRAM cell, the first connect being one of a source or a drain of the transistor; a plurality of word lines (WL) corresponding to R rows such that for each row, the word line WL of that row is electrically coupled to gates of all transistors of that row; a plurality of bit lines (BL) corresponding to C columns such that for each column, the bit line BL of that column is electrically coupled to the tunnel caps of all multiple bit MRAM cells of that column; and a plurality of source lines corresponding to C columns such that for each column, the source line SL of that column is electrically coupled to second connects of all transistors of that column, the second connect being the other of the source or drain of the transistor, wherein for each multiple bit MRAM cell, the fixed layer comprises a magnet whose magnetic moment is fixed to one of a first perpendicular direction and a second perpendicular direction, the first and second perpendicular directions respectively being first and second directions perpendicular to a plane defined by an upper surface of the fixed layer, each free layer comprises a magnet whose magnetic moment is switchable between the first and second perpendicular directions upon an application of a switch current of that free layer, and the switch current of each free layer is different from the switch currents of all other free layers.

Clause 21: The memory cell array of Clause 20, wherein each multiple bit MRAM cell is configured such that the magnetic moment of at least one free layer of that multiple bit MRAM cell is settable independent of the magnetic moments of the other free layers upon the application of the switch current of the at least one free layer.

Clause 22: The method of any of Clauses 20-21, further comprising: a multiplexor (MUX) configured to select one of the plurality of source lines; and a sense amplifier (SA) configured to sense a resistance state of the source line selected by the MUX.

Clause 23: A method of fabricating multiple bit magnetoresistive random access memory (MRAM) cell, the method comprising: forming a fixed layer; forming N tunnel barriers and N free layers on the fixed layer, N being an integer greater than or equal to two, the N tunnel barriers and the N free layers being alternately stacked on the fixed layer beginning with a first tunnel barrier being stacked on the fixed layer; and forming a tunnel cap on an Nth free layer, wherein the fixed layer comprises a magnet whose magnetic moment is fixed to one of a first perpendicular direction and a second perpendicular direction, the first and second perpendicular directions respectively being first and second directions perpendicular to a plane defined by an upper surface of the fixed layer, wherein each free layer comprises a magnet whose magnetic moment is switchable between the first and second perpendicular directions upon an application of a switch current of that free layer, and wherein the switch current of each free layer is different from the switch currents of all other free layers.

Clause 24: The method of Clause 23, wherein the multiple bit MRAM cell is fabricated such that the fixed layer, the alternating N tunnel barriers and N free layers, and the tunnel cap in that order form a series connection.

Clause 25: The method of any of Clauses 23-24, wherein the multiple bit MRAM cell comprises a plurality of magnet-barrier interfaces, each magnet-barrier interface being defined where one of the N free layers interface with one of the N tunnel barriers, and wherein the N tunnel barriers are formed to meet perpendicular magnetic anisotropy (PMA) conditions at the plurality of magnet-barrier interfaces to set the switch current of each free layer to be different from each other.

Clause 26: The method of Clause 25, wherein at least one tunnel barrier is formed from a crystalline oxide in which a lattice of the crystalline oxide is oriented so as to meet the PMA condition of a corresponding magnet-barrier interface.

Clause 27: The method of Clause 25, wherein at least one tunnel barrier is formed to have a thickness so as to meet the PMA condition of a corresponding magnet-barrier interface.

Clause 28: The method of any of Clauses 23-27, wherein at least one free layer is formed such that the magnetic moment of the at least one free layer is settable independent of the magnetic moments of the other free layers upon the application of the switch current of the at least one free layer.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A multiple bit magnetoresistive random access memory (MRAM) cell, comprising:
    a fixed layer;
    N tunnel barriers and N free layers formed on the fixed layer, N being an integer greater than or equal to two, the N tunnel barriers and the N free layers being alternately stacked on the fixed layer beginning with a first tunnel barrier being stacked on the fixed layer; and
    a tunnel cap formed on an Nth free layer,
    wherein the fixed layer comprises a magnet whose magnetic moment is fixed to one of a first perpendicular direction and a second perpendicular direction, the first and second perpendicular directions respectively being first and second directions perpendicular to a plane defined by an upper surface of the fixed layer,
    wherein each free layer comprises a magnet whose magnetic moment is switchable between the first and second perpendicular directions upon an application of a switch current of that free layer,
    wherein the switch current of each free layer is different from the switch currents of all other free layers,
    wherein the multiple bit MRAM cell comprises a plurality of magnet-barrier interfaces, each magnet-barrier interface being defined where one of the N free layers interface with one of the N tunnel barriers, and
    wherein the N tunnel barriers are formed to meet perpendicular magnetic anisotropy (PMA) conditions at the plurality of magnet-barrier interfaces to set the switch current of each free layer to be different from each other.

2. The multiple bit MRAM cell of claim 1, wherein the fixed layer, the alternating N tunnel barriers and N free layers, and the tunnel cap in that order form a series connection.

3. The multiple bit MRAM cell of claim 1, wherein the multiple bit MRAM cell is configured to be in any one of $2^N$ resistance states, a resistance of each resistance state being different from resistances of all other resistance states.

4. The multiple bit MRAM cell of claim 3, wherein a resistance of each free layer is based on the magnetic moment of that free layer such that the resistance state of the multiple bit MRAM cell is based on a combination of magnetic moments of the N free layers.

5. The multiple bit MRAM cell of claim 1, wherein at least one tunnel barrier is formed from a crystalline oxide in which a lattice of the crystalline oxide is oriented so as to meet the PMA condition of a corresponding magnet-barrier interface.

6. The multiple bit MRAM cell of claim 5, wherein the at least one tunnel barrier is formed from magnesium oxide (MgO).

7. The multiple bit MRAM cell of claim 1, wherein at least one tunnel barrier is formed to have a thickness so as to meet the PMA condition of a corresponding magnet-barrier interface.

8. The multiple bit MRAM cell of claim 7, wherein the thicknesses of at least two tunnel barriers are different.

9. The multiple bit MRAM cell of claim 1, wherein at least one free layer is a ferromagnet formed from at least one of cobalt (Co), iron (Fe), palladium (Pd), platinum (Pt), gadolinium (Gd), Terbium (Tb), nickel (Ni), and boron (B).

10. The multiple bit MRAM cell of claim 9, wherein for at least two free layers formed from CoFeB, a relative composition of Co, Fe, and B are different.

11. The multiple bit MRAM cell of claim 1, wherein for at least one free layer, the magnetic moment of the at least one free layer is settable independent of the magnetic moments of the other free layers upon the application of the switch current of the at least one free layer.

12. The multiple bit MRAM cell of claim 1, wherein N=2 such that the N tunnel barriers comprise first and second tunnel barriers and the N free layers comprise first and second free layers in which
the first tunnel barrier is formed on the fixed layer,
the first free layer is formed on the first tunnel barrier,
the second tunnel barrier is formed on the first free layer,
the second free layer is formed on the second tunnel barrier, and
the tunnel cap is formed on the second free layer.

13. The multiple bit MRAM cell of claim 12,
wherein first and second switch currents are switch currents of the first and second free layers, respectively, and first and second magnetic moments are magnetic moments of the first and second free layers, and
wherein the multiple bit MRAM cell is configured such that the first magnetic moment switches independently of the second magnetic moment upon an application of the first switch current, or the second magnetic moment switches independently of the first magnetic moment upon an application of the second switch current, or both.

14. The multiple bit MRAM cell of claim 12, wherein the first and second tunnel barriers are formed from crystalline magnesium oxide (MgO) such that
lattices of the first and second tunnel barriers are different, or
thicknesses of the first and second tunnel barriers are different, or
both.

15. The multiple bit MRAM cell of claim 1, wherein N=3 such that the N tunnel barriers comprise first, second, and third tunnel barriers and the N free layers comprise first, second, and third free layers in which
the first tunnel barrier is formed on the fixed layer,
the first free layer is formed on the first tunnel barrier,
the second tunnel barrier is formed on the first free layer,
the second free layer is formed on the second tunnel barrier,
the third tunnel barrier is formed on the second free layer,
the third free layer is formed on the third tunnel barrier, and
the tunnel cap is formed on the third free layer.

16. The multiple bit MRAM cell of claim 15,
wherein first, second, and third switch currents are switch currents of the first, second, and third free layers, respectively, and first, second, and third magnetic moments are magnetic moments of the first, second, and third free layers, and
wherein the multiple bit MRAM cell is configured such that, the first magnetic moment switches independently of the second and third magnetic moments upon an application of the first switch current, or the second magnetic moment switches independently of the first and third magnetic moments upon an application of the second switch current, or the third magnetic moment switches independently of the first and second magnetic moments upon an application of the third switch current, or any combination thereof.

17. The multiple bit MRAM cell of claim 15, wherein the first, second, and third tunnel barriers are formed from crystalline magnesium oxide (MgO) such that
lattices of the first, second, and third tunnel barriers are different, or
thicknesses of the first, second, and third tunnel barriers are different, or
both.

18. The multiple bit MRAM cell of claim 1, wherein the multiple bit MRAM cell is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IOT) device, a laptop computer, a server, and a device in an automotive vehicle.

19. A memory cell array, comprising:
a plurality of multiple bit magnetoresistive random access memory (MRAM) cells arranged in R rows and C columns, each multiple bit MRAM cell comprising:
a fixed layer;
N tunnel barriers and N free layers formed on the fixed layer, N being an integer greater than or equal to two, the N tunnel barriers and the N free layers being alternately stacked on the fixed layer beginning with a first tunnel barrier being stacked on the fixed layer; and
a tunnel cap formed on an Nth free layer;
a plurality of transistors correspondingly arranged in R rows and C columns such that for each transistor, a first connect of that transistor is electrically coupled to the fixed layer of the corresponding multiple bit MRAM cell, the first connect being one of a source or a drain of the transistor;
a plurality of word lines (WL) corresponding to R rows such that for each row, the word line WL of that row is electrically coupled to gates of all transistors of that row;
a plurality of bit lines (BL) corresponding to C columns such that for each column, the bit line BL of that column is electrically coupled to the tunnel caps of all multiple bit MRAM cells of that column; and
a plurality of source lines corresponding to C columns such that for each column, the source line SL of that column is electrically coupled to second connects of all transistors of that column, the second connect being the other of the source or drain of the transistor,
wherein for each multiple bit MRAM cell,
the fixed layer comprises a magnet whose magnetic moment is fixed to one of a first perpendicular direction and a second perpendicular direction, the first and second perpendicular directions respectively being first and second directions perpendicular to a plane defined by an upper surface of the fixed layer,
each free layer comprises a magnet whose magnetic moment is switchable between the first and second perpendicular directions upon an application of a switch current of that free layer, and
the switch current of each free layer is different from the switch currents of all other free layers,
wherein the multiple bit MRAM cell comprises a plurality of magnet-barrier interfaces, each magnet-barrier interface being defined where one of the N free layers interface with one of the N tunnel barriers, and wherein the N tunnel barriers are formed to meet perpendicular magnetic anisotropy PMA) conditions at the plurality of magnet-barrier interfaces to set the switch current of each free layer to be different from each other.

20. The memory cell array of claim 19, wherein each multiple bit MRAM cell is configured such that the magnetic moment of at least one free layer of that multiple bit MRAM cell is settable independent of the magnetic moments of the other free layers upon the application of the switch current of the at least one free layer.

21. The memory cell array of claim 19, further comprising:
a multiplexor (MUX) configured to select one of the plurality of source lines; and
a sense amplifier (SA) configured to sense a resistance state of the source line selected by the MUX.

* * * * *